United States Patent
Dalgleish

(10) Patent No.: US 11,387,527 B2
(45) Date of Patent: Jul. 12, 2022

(54) BATTERY PASSIVATION MANAGEMENT SYSTEM

(71) Applicant: Scott David Dalgleish, Boulder, CO (US)

(72) Inventor: Scott David Dalgleish, Boulder, CO (US)

(73) Assignee: Phase IV Engineering Inc., Boulder, CO (US)

( * ) Notice: Subject to any disclaimer, the term of this patent is extended or adjusted under 35 U.S.C. 154(b) by 424 days.

(21) Appl. No.: 16/244,792

(22) Filed: Jan. 10, 2019

(65) Prior Publication Data

US 2019/0237739 A1 Aug. 1, 2019

Related U.S. Application Data

(60) Provisional application No. 62/622,846, filed on Jan. 27, 2018.

(51) Int. Cl.
| | |
|---|---|
| H01M 50/54 | (2021.01) |
| H01M 50/543 | (2021.01) |
| G01R 31/364 | (2019.01) |
| G01R 31/3835 | (2019.01) |
| H03K 17/94 | (2006.01) |
| H01M 10/48 | (2006.01) |
| H01M 10/42 | (2006.01) |
| H02J 7/00 | (2006.01) |
| H03K 17/28 | (2006.01) |

(52) U.S. Cl.
CPC ........ *H01M 50/543* (2021.01); *G01R 31/364* (2019.01); *G01R 31/3835* (2019.01); *H01M 10/425* (2013.01); *H01M 10/48* (2013.01); *H02J 7/0069* (2020.01); *H03K 17/94* (2013.01); *H03K 17/28* (2013.01)

(58) Field of Classification Search
None
See application file for complete search history.

(56) References Cited

U.S. PATENT DOCUMENTS

| | | | |
|---|---|---|---|
| 5,415,949 A * | 5/1995 | Stone | H01M 16/00 429/63 |
| 8,847,785 B2 | 9/2014 | Heath | |
| 2015/0171655 A1 | 6/2015 | Venkataramani et al. | |
| 2016/0031394 A1* | 2/2016 | Irish | H02J 7/00 307/9.1 |

* cited by examiner

*Primary Examiner* — Ula C Ruddock
*Assistant Examiner* — Tony S Chuo
(74) *Attorney, Agent, or Firm* — Kenneth Altshuler

(57) ABSTRACT

Described is a battery de-passivation circuit that generally comprises a battery having a de-passivation circuit attached across its positive and negative terminals. The de-passivation circuit includes a switch that can open or close the de-passivation circuit, a resistor that can regulate the amount of current drawn from the battery and a clock and timer controller system that controls the switch. The controller system controls closing the circuit long enough to bring the passivation level build-up within the battery to an acceptable lower level and controls opening the circuit long enough to allow passivation levels to build-up to an acceptable upper level.

18 Claims, 7 Drawing Sheets

BATTERY PASSIVATION MANAGEMENT SYSTEM

CROSS-REFERENCE TO RELATED APPLICATIONS

This application is a non-provisional application which claims priority to and the benefit of U.S. Provisional Patent Application Ser. No. 62/662,847, entitled BATTERY PASSIVATION MANAGEMENT SYSTEM filed Jan. 27, 2018, the entire disclosure of which is hereby incorporated by reference.

FIELD OF THE INVENTION

The present embodiments are directed to battery passivation management systems.

DESCRIPTION OF RELATED ART

Lithium batteries are gaining widespread adoption for a variety of portable electronic devices because they offer a high power density, wide temperature range, lightweight/long life solution compared with today's common electrochemical batteries. Lithium batteries further possess a shelf life that can extend beyond 10 years if power is drawn from the battery in a manner that prevents a phenomenon known as battery passivation. In lithium thionyl chloride batteries, a chemical reaction between the battery electrolyte in the lithium anode can form a thin film of lithium chloride (LiCl) on the surface of the lithium anode. This passivation may cause voltage delay when the battery is under load. This is shown as a minimum voltage level, Voltage Low, ($V_L$) at a Time Low ($T_L$) in the Prior Art graph of FIG. 1. As further shown in the graph, the passivated battery regains peak voltage, Voltage Steady-State ($V_{SS}$) at Time Steady-State ($T_{SS}$) once the internal resistance of the battery cell is lowered to its original state. This sometimes accomplished after the initial discharge reaction removes the passivation layer. Once the load is removed (or lowered) the passivation layer will reform. In many cases, such as wireless sensors where lithium thionyl chloride batteries are commonly used, the battery may have minimal or no power draw, and once a significant passivation layer forms over a time of just a few months, it cannot be effectively removed and the ability for the battery to deliver high current pulses and other critical power delivery performance is inhibited. This is a particular problem when the battery is not used or the battery is disconnected (often with a power switch) from a device that draws power from the battery for a period of just a few months.

It is to innovations related to this subject matter that the claimed invention is generally directed.

SUMMARY OF THE INVENTION

The present invention is directed to battery de-passivation circuits that generally comprises a battery having a de-passivation circuit attached across its positive and negative terminal with certain applications directed to problems associated with one-way and two-way radio frequency communication between devices where turning-off the device could cause battery passivation that may reduce the performance of the device.

Embodiments are generally directed to a battery de-passivation circuit that generally comprises a battery having a de-passivation circuit attached across its positive and negative terminals. The de-passivation circuit includes a switch that can open or close the de-passivation circuit, a resistor that can regulate the amount of current drawn from the battery and a clock and timer controller system that controls the switch. The controller system controls closing the circuit long enough to bring the passivation level build-up within the battery to an acceptable lower level and controls opening the circuit long enough to allow passivation levels to build-up to an acceptable upper level.

Certain embodiments of the present invention contemplate a battery de-passivation circuit comprising: a first electrical lead adapted to connect to a positive terminal on a battery; a second electrical lead adapted to connect to a negative terminal on the battery; the first and the second electrical lead disconnected unless connected by an electrical switch; a clock and timer controller connected to the electrical switch, the controller configured to actuate the electrical switch closed to connect the first and the second electrical lead for a closed amount of time and to disconnect the first and the second electrical lead for an open amount of time; and a resistor in-line with the first and the second electrical lead, the resistor possessing a predetermined resistance adapted to reduce, prevent, or eliminate a passivation layer build-up in the battery during the closed amount of time, the controller further adapted to hold open the electrical switch for the open amount of time to allow a predetermined amount of the passivation layer to build up in the battery.

Other embodiments contemplate a method for de-passivate a battery with the de-passivation circuit, the method comprising: connecting a first electrical lead to a positive terminal on the battery and a second electrical lead to a negative terminal on the battery; providing a resistor in-line with the first electrical lead and the second electrical lead; de-passivating the battery to a predetermined de-passivation level by electrically connecting the first electrical lead with the second electrical lead to form a closed-circuit for a closed-circuit amount of time, a clock and timer controller controlling electrically connecting the first electrical lead with the second electrical lead for a closed-circuit amount of time; passivating the battery to a predetermined passivation level by electrically disconnecting the first electrical lead with the second electrical lead to form an open-circuit for an open-circuit amount of time via the clock and timer controller.

Yet other embodiments contemplate a one-way or two way wireless sensor where the sensor may not be used (and be turned-off) for extended periods of time. For example, some wireless sensors are used for special short-term tests in labs, but spend most of their time turned-off and in-storage. Inventive concepts here address managing battery passivation when the sensor is in storage so that when the wireless sensor is put into use again, the battery performance (and wireless sensor operation) is not inhibited by passivation that occurred during storage.

Other embodiments contemplate the sensor device just described further comprising a wireless sensor that only activates during rare events—such a wireless sensor that detects a flood in a basement where a water "float switch" applies power to a wireless transmitter. The wireless sensor may only operate once every 5 years—and be in "off mode" during the long periods of time where no flood is detected. Concepts herein address handling passivation of the battery during these long periods of time where no (or very little) power is drawn from the battery (over which time, passivation can occur). Accordingly, battery passivation levels that disable the battery would be prevented during these long "off times" and the battery would be non-passivated and "fresh" so that the sensor can perform when a flood occurs.

DETAILED DESCRIPTION

Initially, this disclosure is by way of example only, not by limitation. Thus, although the instrumentalities described herein are for the convenience of explanation, shown and described with respect to exemplary embodiments, it will be appreciated that the principles herein may be applied equally in other types of situations involving similar uses of the disclosed techniques to manage battery passivation. In what follows, similar or identical structures may be identified using identical callouts.

Aspects of the present invention are generally related to managing battery passivation, such as that which occurs in lithium thionyl chloride batteries, for portable electric devices. For ease of explanation, embodiments described herein are directed to, but not limited to, remote sensors and transceiver systems that are powered by batteries that passivate, such as lithium thionyl chloride batteries. Also, for ease of explanation, the following embodiments will be described by way of a wireless temperature monitoring system 200 designed to be used in a lab to wirelessly monitor temperature. Nonetheless, the described embodiments are not limited to the lab wireless temperature monitoring device 200 [or simply "sensor device" 200], rather the inventive concepts described herein are envisioned to extend more broadly to other intermittently used electronic devices that incorporate batteries that passivate.

Figure 1:
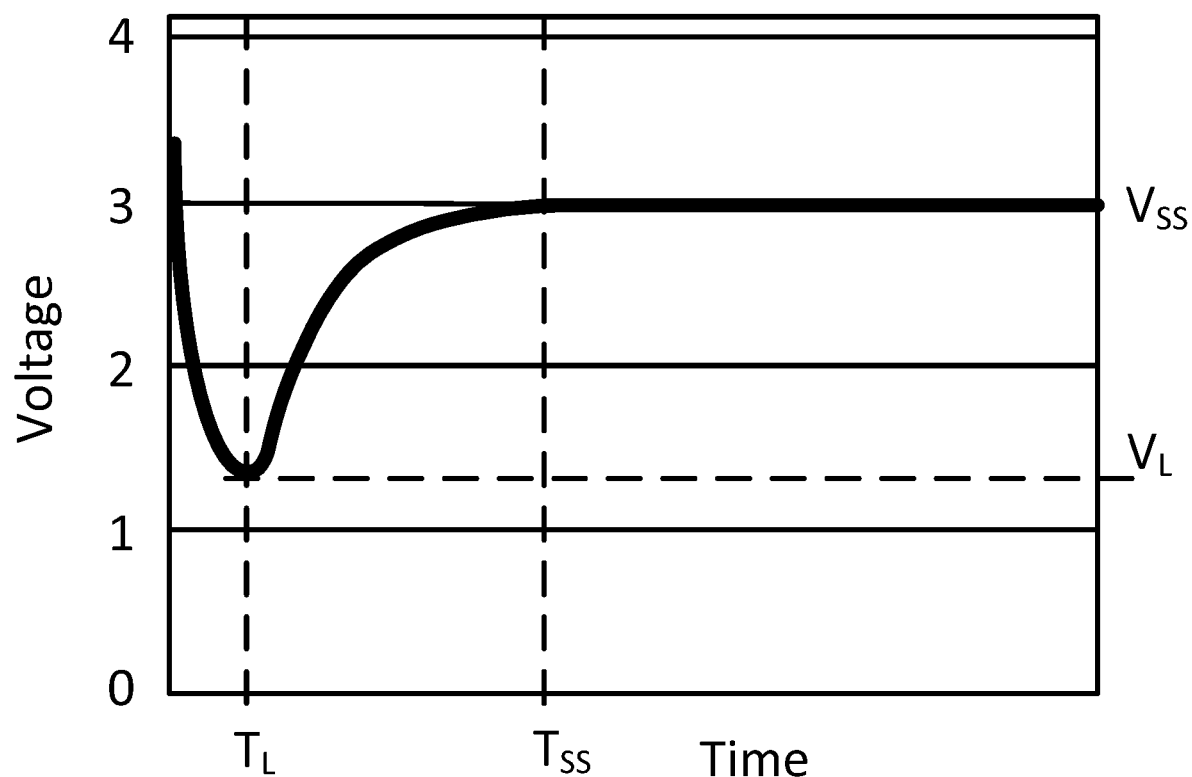
FIG. 1 illustratively depicts a prior art plot of passivation in a lithium ion battery with respect to voltage over time.
Figure 2:
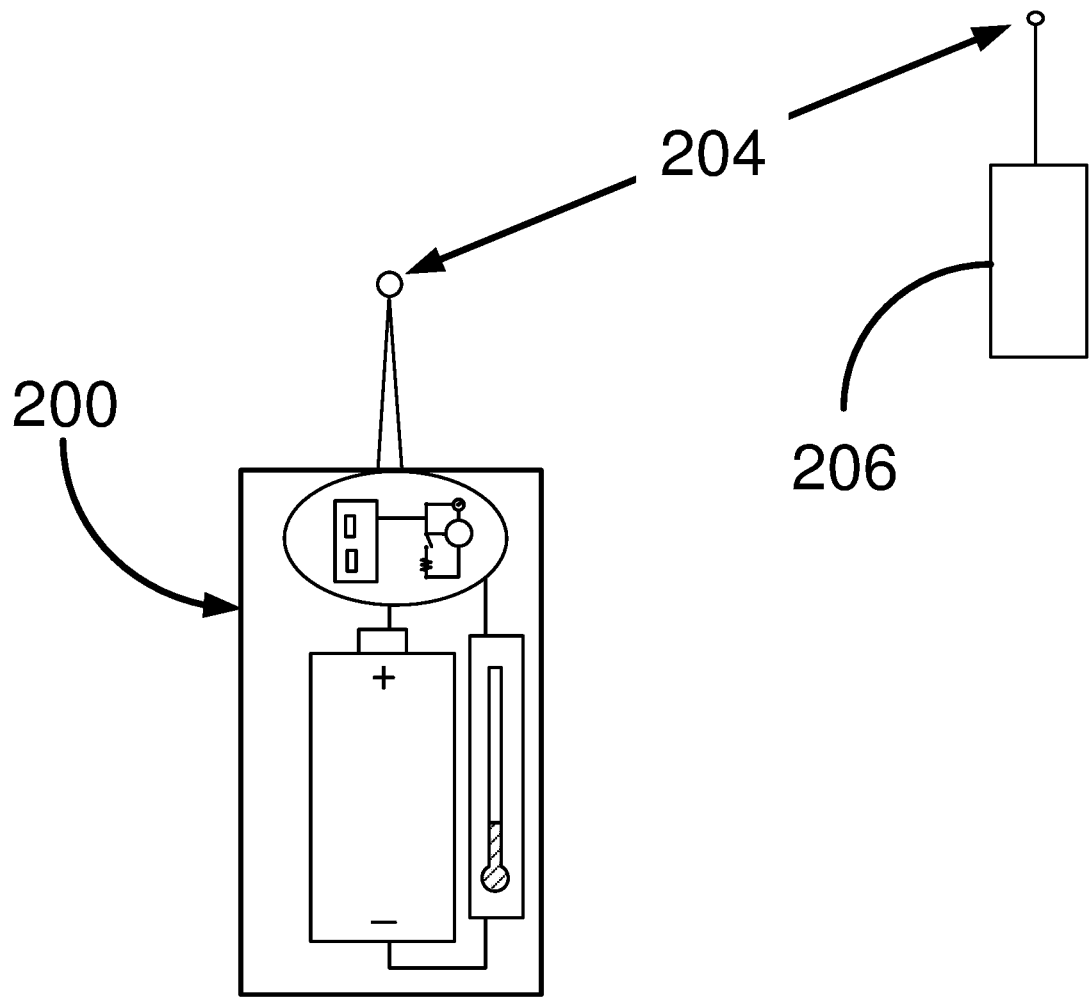
FIG. 2 depicts an artistic drawing of a certain type of wireless sensor—a wireless sensor used occasionally to monitor the temperature sensing capabilities consistent with embodiments of the present invention.

FIG. 2 depicts an artistic drawing of a certain type of wireless sensor—a wireless sensor used occasionally in a lab to monitor the temperature sensing capabilities consistent with embodiments of the present invention. As shown, the lab wireless temperature monitoring device, or sensor device, 200 is capable of two-way wireless communication 204 whereby the wireless sensor device 200 can possess one or more sensors to monitor a lab test (e.g., temperature sensor). A radio frequency antenna is included with of the sensor device 200 along with the appropriate transceiver, memory, sensors, computer processor and related computer functional capabilities all powered by a lithium thionyl chloride battery. One or more external transceivers 206 can be used to communicate with the sensor device 200 when in range. Information gathered, in one embodiment, is envisioned to be processed onboard the sensor device 200 to monitor the temperature (and other sensor readings) of the object under test in the lab, or other setting used with the sensor device 200.

Figure 3:
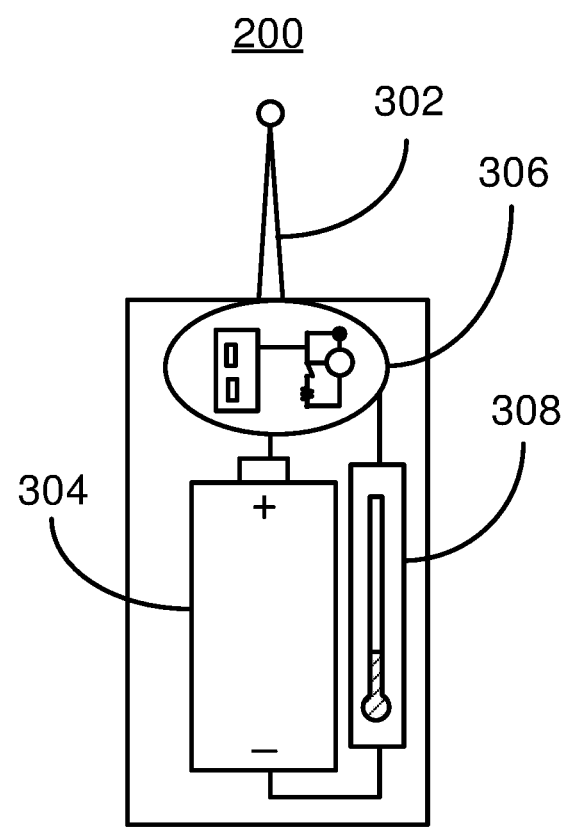
FIG. 3 illustratively depicts a line drawing of an embodiment of the wireless temperature sensor components consistent with embodiments of the present invention.

FIG. 3 illustratively depicts a line drawing of an embodiment of the wireless temperature sensor components consistent with embodiments of the present invention. As shown, the sensor device 200 includes a temperature sensor 308 that is connected to a lithium thionyl chloride battery 304, an antenna 302, and a circuit board 306 that includes the necessary circuits, memory, controllers, transceiver elements and other electrical constructs known to those skilled in the art. The antenna 302 is envisioned adapted to transmit and receive wireless signals from a compatible transceiver, such as external transceivers 206. The battery 304 is shown with a positive and negative terminal.

Once the lithium thionyl chloride battery is manufactured, the battery 304 is in danger of building up an excessive passivation layer over time while the wireless sensor device 200 is not in use. This is particularly a problem during the time from when the sensor is manufactured to when the sensor device 200 is utilized. It is also a problem when the sensor device 200 is not in use, such as when in storage. In other words, without a de-passivation circuit, the battery 304 is in jeopardy of building up an excessive passivation layer while the sensor 200 is in transit from manufacture or when turned-off for extended periods of time at a customer site. During the transit time, the sensor device 200 is envisioned to be turned off whereby the sensor device 200 is incapable of transmitting or receiving signals. Certain embodiments envision the time wherein the sensor device 200 is turned off and current is drawn from the battery 304 intermittently to control the state of passivation. One embodiment contemplates accomplishing controlling the state of passivation via a de-passivation circuit discussed in terms of embodiments herein.

Figure 4A:
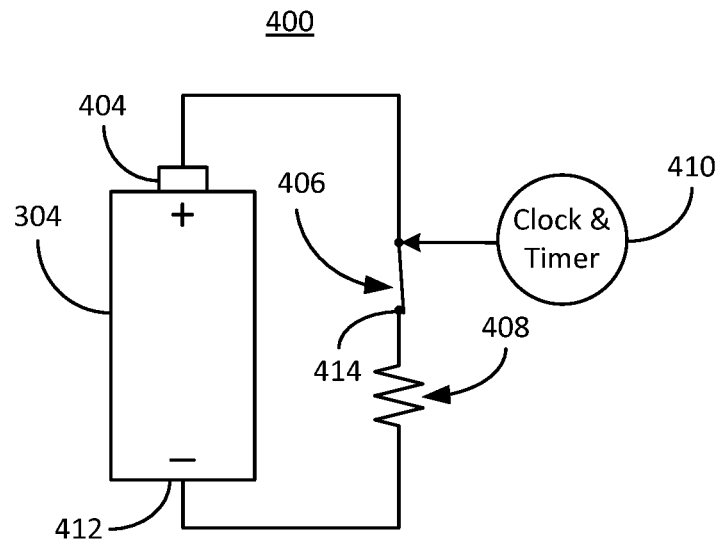
FIGS. 4A and 4B depict schematics of a de-passivation circuit embodiment turned on and turned off consistent with embodiments of the present invention.
Figure 4B:
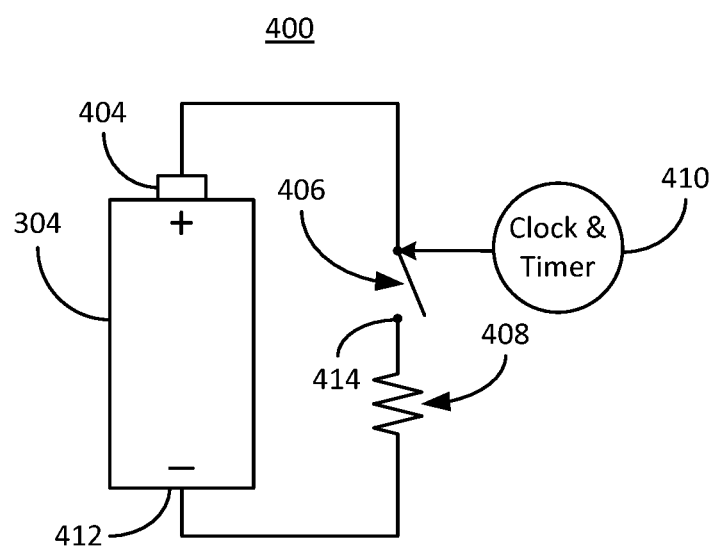

FIGS. 4A and 4B depict a block diagram of a passive de-passivation circuit embodiment consistent with embodiments of the present invention. As shown in FIG. 4A, the de-passivation circuit 400 is essentially a closed-circuit with a resistor 408 that extends across the positive lead 404 and the negative lead 412 of a battery 304. The resistor 408 is sized with the appropriate resistance to de-passivate the battery 304 over a predetermined amount of time to an extent where the battery 304 performs with a desired voltage. In other words, the de-passivation circuit 400 is put in a conductively closed state for just enough time to draw current in the battery to reach the desired level of de-passivation. Some embodiments contemplate the length of time that current is drawn is predetermined and controlled by the clock and timer system 410. The clock and timer system 410 can operate under its own power supply. When enough time has elapsed to de-passivate the battery 304 to the desired level, the clock and timer system 410 can control a gate 406 to open thus halting current draw from the battery 304, FIG. 4B. With the de-passivation circuit 400 open, the battery 304 will begin to passivate. The clock and timer system 410 can control the gate 406 to close after a predetermined amount of time has elapsed to, once again, de-passivate the battery 304. The gate 406 is an electrical switch component known to those skilled in the art that can "make" (closed circuit) or "break" (open circuit) an electrical circuit providing or interrupting current along a conductive path.

Figure 5A:
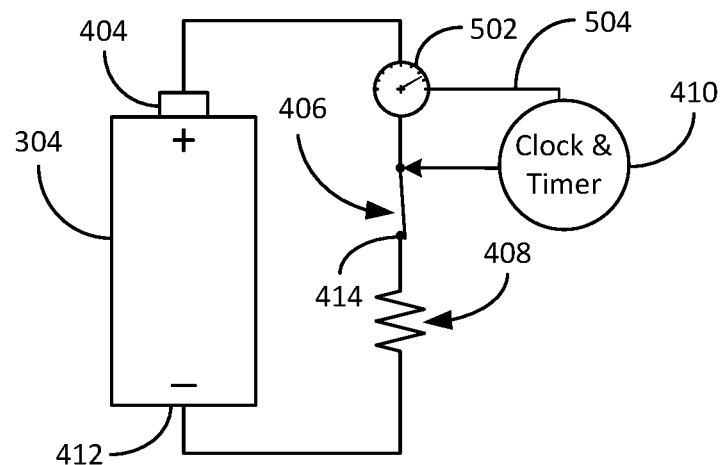
FIGS. 5A and 5B illustratively depict schematics of a de-passivation circuit embodiment turned on and turned off and having a voltage sensor/gauge consistent with embodiments of the present invention.
Figure 5B:
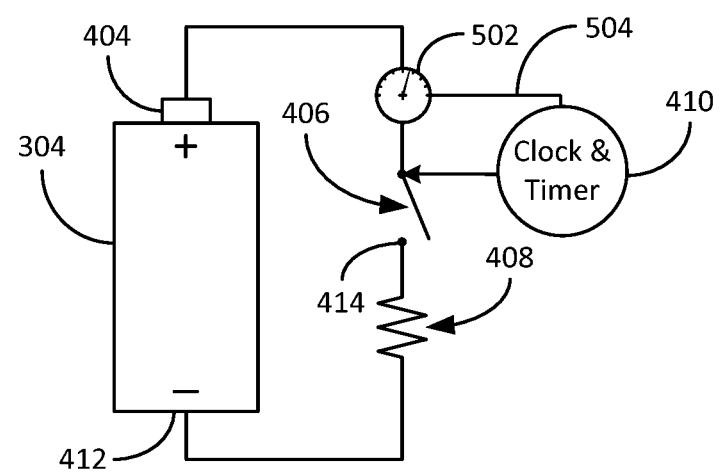

FIGS. 5A and 5B depict a block diagram of an active de-passivation circuit consistent with embodiments of the present invention. Similar to the de-passivation circuit 400 of FIGS. 4A and 4B, the de-passivation circuit 500 provides a voltage tap gauge 502 that measures the voltage across the battery 304. When the gate 406 is closed, FIG. 5B, current can be drawn until a desired level of de-passivation is reached. The voltage tap gauge 502 measures the change in voltage determining when the desired level of de-passivation is reached. The voltage tap gauge 502 is electrically linked 504 to the clock and timer system 410 therefore providing feedback to the clock and timer system 410 to open the gate 406 upon reaching the desired level of de-passivation, FIG. 5B. As previously discussed, voltage level is intrinsically tied to the amount of passivation build-up in the battery 304. In this way, the minimum amount (or near/essentially the minimum amount) of current is pulled from the battery 304 thus prolonging the battery's life.

Though the above examples of a de-passivation circuit operation are directed to in-transit time (the time where the battery unit is being shipped from one location to another) wherein the wireless sensor transceiver is turned off, other embodiments envision continued employment of a de-passivation circuit when the transceiver is turned on. In cases where the transceiver is not used for a long period of time, the battery 304 may once again begin to passivate putting the battery in a compromised state to fulfill the power needs of the transceiver. In this scenario, certain embodiments envision the clock and timer system 410 further connected to the transceiver whereby when the transceiver pulls current from the battery 304, the clock and timer system 410 resets to avoid unnecessary current draws from the battery 304 in order to best preserve the life of the battery 304. This is illustratively shown in more detail in FIGS. 5C and 5D.

Figure 5C:
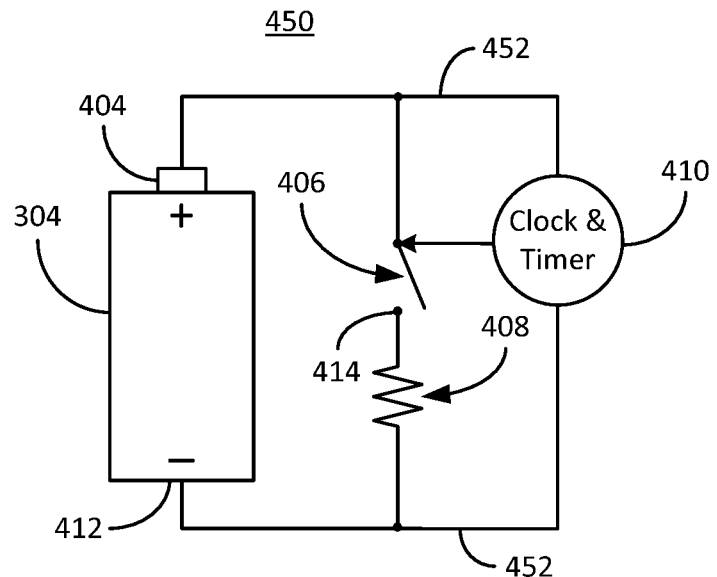
FIG. 5C illustratively depicts a schematic of a de-passivation circuit embodiment with the clock and timer system powered by the battery consistent with embodiments of the present invention.
Figure 5D:
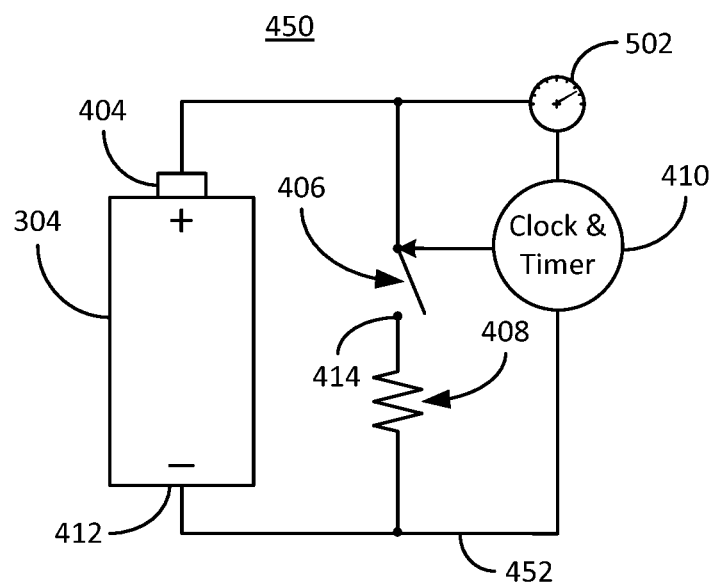
FIG. 5D illustratively depicts a schematic of a de-passivation circuit embodiment having a voltage sensor, along with a clock and timer system powered by the battery consistent with embodiments of the present invention.

FIG. 5C depicts a block diagram of yet another embodiment passivation circuit consistent with embodiments of the present invention. As shown, the clock and timer system 410 (and all intervening control circuitry that are not shown for illustrative convenience that are known to those skilled in the art) can be powered by the battery 304. The clock and timer system 410 can be configured and arranged to draw very low amounts of current from the battery 304 (milliamps to microamps depending on what empirically or theoretically shows to work best for the battery in the circuit), thus eliminating the need for an independent battery powering the clock and timer system 410. As shown in FIG. 5D, it is further conceivable that a voltage measuring system 502 that gauges the voltage of the battery 304 can be put in line with the clock and timer system 410, which can provide feedback to the clock and timer system 410 that the passivation level in the battery 304 is too high. Another embodiment contemplates the clock and timer system 410 in conjunction with a voltage tap gauge 502 drawing a short burst of current from the battery 304 that simulates the current used to operate the transceiver (or some other current value that is higher or lower) to evaluate internal battery resistance and passivation. If under this test the battery 304 is proving to reach an undesirable passivation level, the de-passivation circuit 450 can be turned on to bring the passivation levels of the battery 304 to a desired level.

Figure 6:
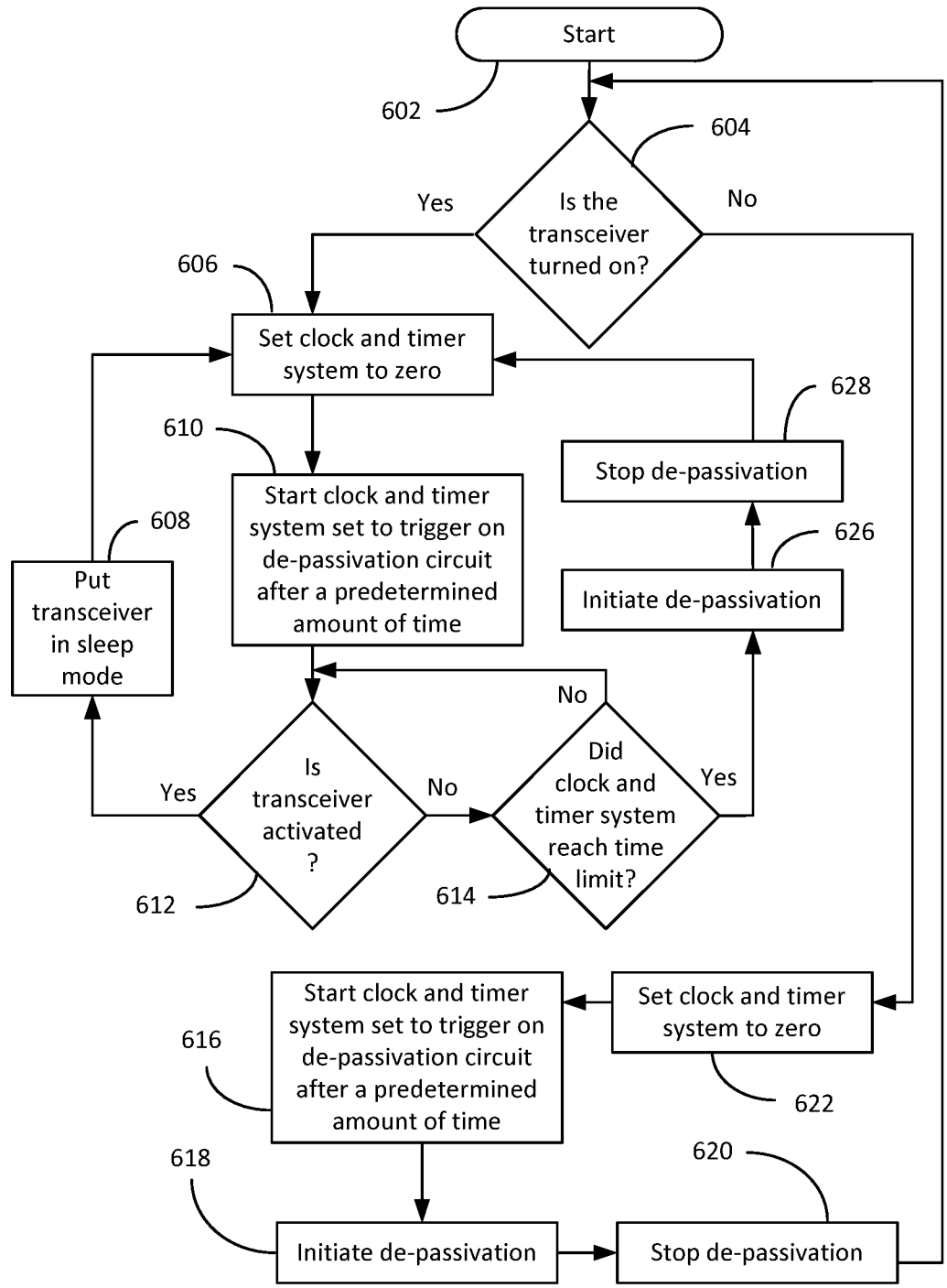
FIG. 6 illustratively depicts a method block steps to practice some embodiments of the present invention in accordance with embodiments of the present invention.

FIG. 6 shows a block diagram of a method to use a de-passivation circuit consistent with embodiments of the present invention. In the present method embodiment the "start" step 602 is envisioned to be at a point when the battery 304 is first connected to a wireless sensor during initial manufacturing. Of course, the start step 602 is not limited to this scenario, rather there are a number of conceivable scenarios that justify a reasonable starting point for the method of FIG. 6. Embodiments of a de-passivation circuit are illustratively depicted in terms of FIGS. 4 and 5, however a number of different de-passivation circuit configurations are conceivable within the scope and spirit of the present invention to accomplish the method steps described below.

In the scenario where the transceiver is not turned on (step 604), such as when the sensor device 200 is in transit from the manufacturer to customer site, proceed to step 622 where the clock and timer system 410 is initialized or set to zero. The clock and timer system 410 starts its timer, step 616. The clock and timer system 410 is then set to turn on the de-passivation circuit 400 (or 500) after a predetermined amount of time. As previously discussed, the de-passivation circuit 400 (or 500) is turned on by closing the gate 406 to complete the circuit 400 (or 500). In the scenario of the de-passivation circuit 400 of FIGS. 4A and 4B, the resistor 408 is "tuned", or sized with a designed/calculated resistance, to de-passivate the battery 304 at the desired level (current or voltage) over a predicted amount of time. The clock and timer system of 410 is program to keep the gate 406 closed (holding the de-passivation circuit 400 on) until the predicted amount of time has elapsed, step 618. At that point, the clock and timer system 410 opens the gate 406 thereby turning the de-passivation circuit 400 off, step 620. Proceed to decision step 604.

If, on the other hand, the transceiver in the wireless sensor 200 is active, turned on, or in an on-state, step 604, proceed to step 606 whereby the clock and timer system 410 is initialize or set to zero time. At this point, the clock and timer system 410 starts its countdown to a predetermined set time to control turning on the de-passivation circuit 400 (or 500), step 610. The predetermined set time is the amount of time that is allowed to elapse before the clock and timer system 410 is made to turn on the de-passivation circuit 400 (or 500). Over this period of time, the sensor device 200 is in a quiescent state—that is it is drawing low to no power, but can be turned on to take measurements and transmit those measurements via some mechanism, such as a timer or other input. As shown in step 612, if the transceiver in the sensor device 200 is activated (drawing functional power, such as to transmit a signal and adequate to prevent battery passivation) before the predetermined set time is reached then wait until the transceiver is finished its activity (i.e., finished drawing functional power) and is put in sleep mode (the quiescent state), step 608. The battery 304 should now be de-passivated due to being used at step 608. Then proceed back to setting the clock and timer system 410 back to zero, step 606. If, however in step 612 the transceiver is not activated before the predetermined amount of time is reached (step 614), proceed to step 626 to turn on the passivation circuit 400 (or 500). In the embodiment of FIGS. 4A and 4B, the de-passivation circuit 400 is on for a predetermined amount of time believed sufficient to de-passivate the battery 304 before turning the de-passivation circuit 400 off, step 628. In the embodiment of FIGS. 5A and 5B, the de-passivation circuit 500 is on until the voltage tap gauge 502 indicates the battery 304 is sufficiently de-passivated before turning the de-passivation circuit 500 off, step 628. Either way, step 628 points back to setting be clock and timer system back to zero, step 606. Returning to the decision 614, if the clock and timer system 410 did not reach its predetermined time limit keep looping back to step 612 until either the time limit is reached or the transceiver is activated.

It is to be understood that even though numerous characteristics and advantages of various embodiments of the present invention have been set forth in the foregoing description, together with the details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, though a lithium thionyl chloride battery is used for illustrative purposes herein, the discussed inventive concepts can be applied equally to other kinds of batteries that passivate in a way similarly to lithium thionyl chloride batteries. Another example is the inventive concepts herein can be applied equally to electronics other than a lab wireless sensor that require intermittent battery use without departure from the scope and spirit of the present invention. Yet another example is the clock and timer system 410 is depicted as a simple functional block, however reality this is a controller with a timing crystal and the appropriate electronics that make up a standard system known to those skilled in the art. Additionally, the gate 406 is yet another simplified example of electrical structures which function as an on-off switch to fulfill the circuit requirements described herein. Though the resistor 408 is shown as a single resistor in line with the positive and negative leads (404 and 412) of the battery 304, other circuit schemes known to those skilled in the art to draw current from the battery in the manner described are contemplated in fall within the scope and spirit of the present invention. Further, the terms "one" is synonymous with "a", which may be a first of a plurality.

It will be clear that the present invention is well adapted to attain the ends and advantages mentioned as well as those inherent therein. While presently preferred embodiments have been described for purposes of this disclosure, numerous changes may be made which readily suggest themselves to those skilled in the art and which are encompassed in the spirit of the invention disclosed.

What is claimed is:

1. A battery de-passivation circuit comprising:
    a first electrical lead connected to a positive terminal on a battery;
    a second electrical lead connected to a negative terminal on the battery;
    an electrical switch connected to the first and the second electrical lead, said electrical switch defining an open orientation with the first and the second electrical leads electrically disconnected from one another and said electrical switch defining a closed orientation with the first and the second electrical leads electrically connected;
    a clock and timer controller connected to the electrical switch;
    the electrical switch is in said open orientation for an open circuit period of time based on a first control input from said clock and timer controller and the electrical switch is in said closed orientation for a closed circuit period of time based on a second control input from said clock and timer controller; and
    a resistor in-line with the first and the second electrical lead, the resistor possessing a resistance that matches a predetermined reduction in a passivation layer build-up in the battery over said closed circuit period of time, the passivation layer build-up materializes over said open circuit of time.

2. The battery de-passivation circuit of claim 1 wherein the electrical switch is a conductive gate that forms contact between the first electrical lead and the second electrical lead.

3. The battery de-passivation circuit of claim 1 further comprising a voltage meter that measures voltage across the battery, the voltage meter connected to the clock and timer controller, the voltage meter provides voltage level feedback to the clock and timer controller, the voltage level is intrinsically related to the passivation build-up in the battery.

4. The battery de-passivation circuit of claim 3 wherein the clock and timer controller determines how long the closed circuit period of time will be from the voltage level feedback.

5. The battery de-passivation circuit of claim 1 further comprising an electrical device that utilizes the battery wherein even though the electrical device is turned off the de-passivation circuit is operational.

6. The battery de-passivation circuit of claim 1 wherein the open circuit period of time is a predetermined amount of time.

7. The battery de-passivation circuit of claim 1 wherein the closed circuit period of time is a predetermined amount of time and said predetermined reduction in passivation layer build-up in the battery is devoid of analysis.

8. A battery de-passivation circuit in a sensor device comprising:
    a physical change value sensor;
    a physical change value from said physical change value sensor;
    a transmitter connected to and powered by a battery;
    a first electrical lead connected to a positive terminal on the battery;
    a second electrical lead connected to a negative terminal on the battery;
    a controller communicatively connected to an electrical switch,
    the electrical switch is in a closed orientation when the first and the second electrical leads are connected and in an open orientation when the first and the second electrical leads are disconnected,
    the timer controller comprising a battery passivation instruction and a battery de-passivation instruction that toggle said electrical switch in said open and said closed orientations when executed by said timer controller with said electrical switch,
    said battery passivation instruction is defined by an open period of time over which said first and said second electrical leads are disconnected, and
    said battery de-passivation instruction is defined by a closed period of time over which said first and said second electrical leads are connected;
    a resistor in-line with the first and the second electrical lead when said electrical switch is in a closed configuration,
    said resistor comprising a resistance that matches a predetermined reduction in a passivation layer build-up in the battery over said closed period of time.

9. The sensor device of claim 8 wherein the sensor device is configured to only transmit the physical change value during said closed period of time when said sensor device is in a quiescent state.

10. The sensor device of claim 9 wherein the controller is further configured to execute said battery de-passivation instruction if the quiescent state exceeds the open period of time.

11. The sensor device of claim 9 further comprising a voltage sensor connected to the battery, the voltage sensor adapted to provide voltage level feedback to the controller to adjust the open period of time and/or the closed period of time.

12. The sensor device of claim 11 wherein the controller is further adapted to actuate the electrical switch closed during the open period of time long enough to collect a voltage level from the battery via the voltage sensor.

13. A battery de-passivation circuit comprising: a battery comprising a passivation layer; a first electrical lead connected to a positive terminal on the battery; a second electrical lead connected to a negative terminal on the battery; an electrical switch comprising a closed orientation defined when said first and said second electrical leads are in a closed circuit with said battery, said battery comprising a lower amount of said passivation layer of passivation after a closed period of time in said closed circuit, said electrical switch comprising an open orientation defined when said first and said second electrical leads are in an open circuit with said battery, said battery comprising an upper amount of said passivation layer after an open period of time in said open circuit; a controller that controls said upper amount and said lower amount of said passivation layer via said open period of time and said closed period of time, said controller connected to said electrical switch, said upper amount of said passivation layer comprises a greater amount of passivation build-up in said battery than said lower amount of said passivation layer; and a resistor that is in line with the first and the second electrical leads when the electrical switch is in said closed orientation, said resistor assists in reduction of said upper amount of said passivation layer to said lower amount of said passivation layer during said closed period of time, wherein said resistor comprises a resistance that matches said reduction with respect to said closed period of time.

14. The battery de-passivation circuit of claim 13 wherein the battery de-passivation circuit further comprises a sensor that senses voltage across the battery, said voltage is indicative of either said upper amount of said passivation layer or said lower amount of said passivation layer.

15. The battery de-passivation circuit of claim 14 further comprising a transmitter that transmits said voltage to an end user.

16. The battery de-passivation circuit of claim 15 wherein said battery de-passivation circuit comprises a subroutine that causes the electrical switch to be in said closed orientation intermittently during said open period of time.

17. The battery de-passivation circuit of claim 16 further comprising a means for sensing voltage across the battery during said intermittent closed orientation and a means for communicating the sensed intermittent voltage to an end user.

18. The battery de-passivation circuit of claim 17 further comprising an end user intervention routine that causes initiation of said close period of time if said sensed intermittent voltage is determinative of said upper amount of said passivation layer.

* * * * *